(12) United States Patent
Liaw

(10) Patent No.: US 7,354,833 B2
(45) Date of Patent: Apr. 8, 2008

(54) METHOD FOR IMPROVING THRESHOLD VOLTAGE STABILITY OF A MOS DEVICE

(75) Inventor: Jhon Jhy Liaw, Hsin-Chu (TW)

(73) Assignee: Taiwan Semiconductor Manufacturing Co., Ltd., Hsin-Chu (TW)

(*) Notice: Subject to any disclaimer, the term of this patent is extended or adjusted under 35 U.S.C. 154(b) by 384 days.

(21) Appl. No.: 11/150,015

(22) Filed: Jun. 10, 2005

(65) Prior Publication Data
US 2006/0281267 A1    Dec. 14, 2006

(51) Int. Cl.
*H01L 21/8234* (2006.01)
(52) U.S. Cl. .................. 438/289; 438/301; 438/305; 257/E21.644
(58) Field of Classification Search ......... 257/E21.644
See application file for complete search history.

(56) References Cited

U.S. PATENT DOCUMENTS

| | | | |
|---|---|---|---|
| 5,489,540 A * | 2/1996 | Liu et al. | 438/228 |
| 5,512,498 A * | 4/1996 | Okamoto | 438/228 |
| 5,518,941 A * | 5/1996 | Lin et al. | 438/291 |
| 6,187,643 B1 * | 2/2001 | Borland | 438/302 |
| 2002/0033511 A1 * | 3/2002 | Babcock et al. | 257/408 |
| 2004/0014264 A1 * | 1/2004 | Oh | 438/197 |
| 2004/0082133 A1 * | 4/2004 | Salling et al. | 438/301 |

* cited by examiner

*Primary Examiner*—Stephen W. Smoot
(74) *Attorney, Agent, or Firm*—Kirkpatrick & Lockhart Preston Gates Ellis LLP (57) ABSTRACT

This invention provides a method for improving threshold voltage stability of at least one metal-oxide-semiconductor (MOS) device. In one embodiment of the invention, at least one well is formed on a semiconductor substrate. A gate dielectric layer is formed on the well of the semiconductor substrate. A gate conductive layer is formed on the gate dielectric layer. Ions are implanted into the well to from at least one first buried doped region beneath the gate dielectric layer, and one or more second buried doped regions beneath at least one location of the well that is earmarked for forming a lightly doped drain (LDD) region.

18 Claims, 10 Drawing Sheets

METHOD FOR IMPROVING THRESHOLD VOLTAGE STABILITY OF A MOS DEVICE

BACKGROUND

The present invention relates generally to semiconductor processing technology, and more particularly to a method for improving threshold voltage stability of a metal-oxide-semiconductor (MOS) device.

Memory devices often play an important role in modern electronic systems. One of the most widely used memory devices is the random access memory (RAM), such as static random access memory (SRAM) and dynamic random access memory (DRAM). SRAM is a type of RAM that holds data until the values of the data are either overwritten or the power supplied thereto is taken away. This is opposed to DRAM, which allows the data to exit by the cells discharging every few milliseconds unless it is refreshed. The major layout areas of a SRAM chip are the memory cell area, logic circuit area, and input/output (I/O) circuit area. A SRAM cell is typically composed of four or six MOS devices. The SRAM cell needs not to be refreshed, and is therefore very fast, with access times in a range between 0.2 and 100 nano-seconds.

As integrated circuit (IC) chips continue to scale down, the threshold voltage stability of MOS devices in an SRAM cell becomes a concern of reliability. Conventionally, an extra ion implantation process is used to increase the dopant density in wells of the MOS devices for compensating the dopants diffused out of the channel region thereof during thermal processes. However, this extra implantation process can have adverse effects, such as higher junction capacitance, and channel dopant fluctuation, on the MOS devices in the SRAM cell. These adverse effects may cause instability of the threshold voltages of the MOS devices.

Therefore, desirable in the art of semiconductor processing technology are methods for improving the threshold voltage stability of the MOS devices.

SUMMARY

This invention provides a method for improving threshold voltage stability of at least one metal-oxide-semiconductor (MOS) device. In one embodiment of the invention, at least one well is formed on a semiconductor substrate. A gate dielectric layer is formed on the well of the semiconductor substrate. A gate conductive layer is formed on the gate dielectric layer. Ions are implanted into the well to from at least one first buried doped region beneath the gate dielectric layer, and one or more second buried doped regions beneath at least one location of the well that is earmarked for forming a lightly doped drain (LDD) region.

The construction and method of operation of the invention, however, together with additional objectives and advantages thereof will be best understood from the following description of specific embodiments when read in connection with the accompanying drawings.

DESCRIPTION

Figure 1A:
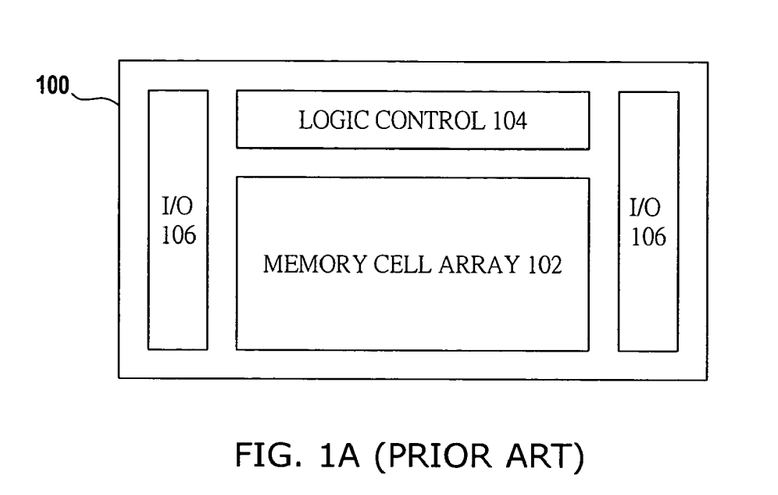
FIG. 1A presents a layout view of a typical SRAM device.

FIG. 1A presents a layout view of a typical SRAM device 100. The SRAM device 100 includes a SRAM cell array area 102, a logic control circuitry area 104, and one or more I/O circuitry area 106. The SRAM cell array 102 typically includes a plurality of SRAM cells, each of which is comprised of four or six MOS devices.

Figure 1B:
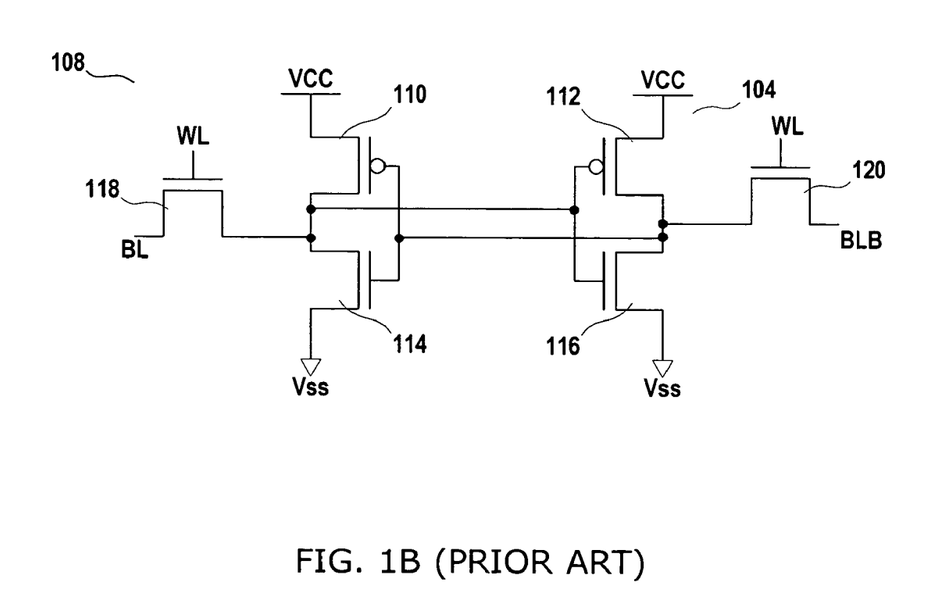
FIG. 1B presents a typical SRAM cell schematic.

FIG. 1B schematically presents a six-transistor SRAM cell 108 that holds one bit of data. The SRAM cell 108 includes two PMOS devices 110 and 112, two NMOS devices 114 and 116, and two pass gate devices 118 and 120. The signal on the word line (WL) activates the pass gate devices 118 and 120 to allow a read or write operation of the cell 108. The bit line (BL) and the bit line bar (BLB) output the data bit stored in the SRAM cell 108.

Figure 2A:
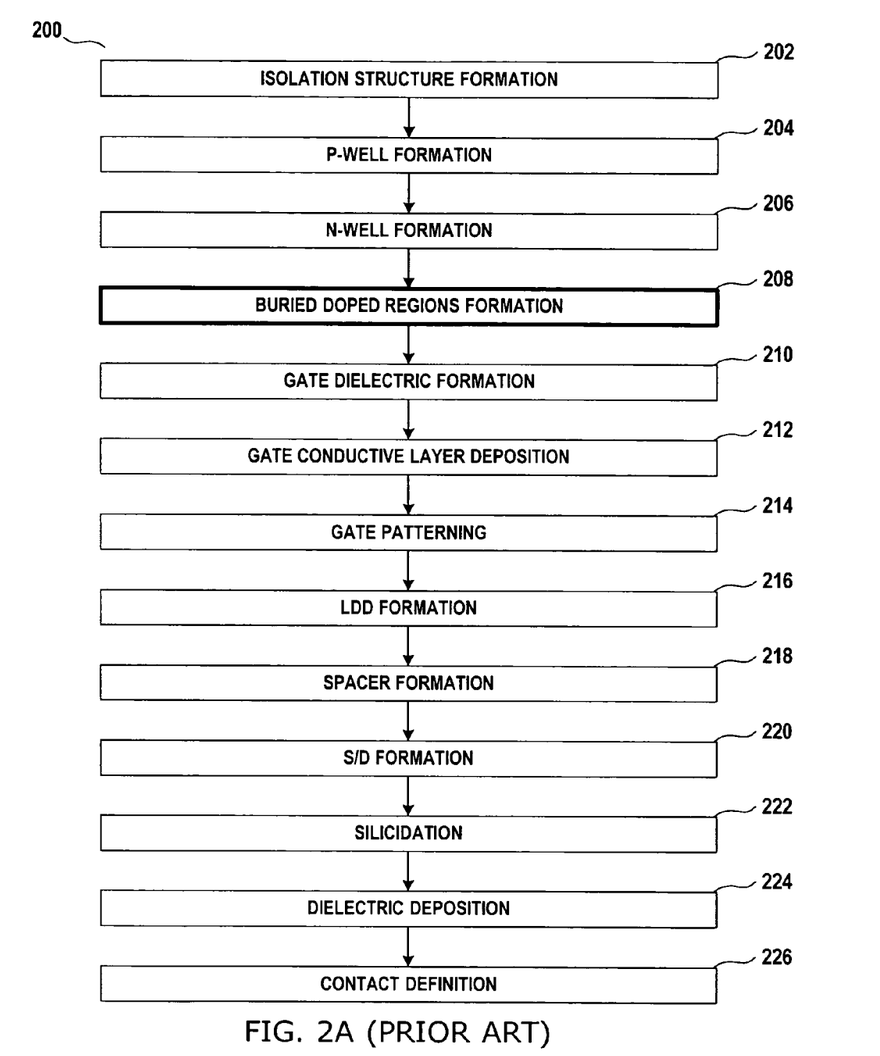
FIGS. 2A through 2D present a conventional fabrication method for constructing a complementary MOS (CMOS) device used in a SRAM cell.
Figure 2B:
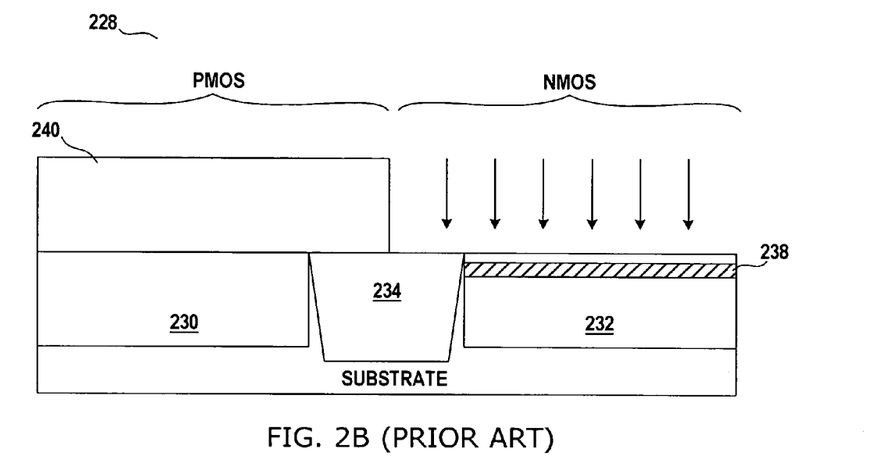

FIG. 2A presents a conventional method 200 for constructing the MOS devices used in a SRAM device, such as the one shown in FIG. 1A. The method 200 includes a series of process steps from 202 to 226. FIG. 2B presents a cross-sectional view 228 of a CMOS structure that is produced after the process step 208. Now referring to both FIGS. 2A and 2B, the method 200 starts with the process step 202 in which an isolation structure 234 is formed on a semiconductor substrate to isolate a N-well 230 and a P-well 232. The wells are formed during the process steps 204 and 206, using standard semiconductor processing techniques, as required to provide active areas for construction of the PMOS and NMOS devices.

The process step 208 is a widely-used conventional extra ion implantation step for increasing the dopant density in the P-well 232 in order to compensate the out-diffused dopants caused by thermal processes. During the process step 208, a photoresist layer 240 is selectively deposited on the substrate to prevent the ions from being implanted in the N-well 230. An ion implantation process is then performed to produce a buried doped region 238 in the P-well 232. Thereafter, the photoresist layer 240 is removed.

Figure 2C:
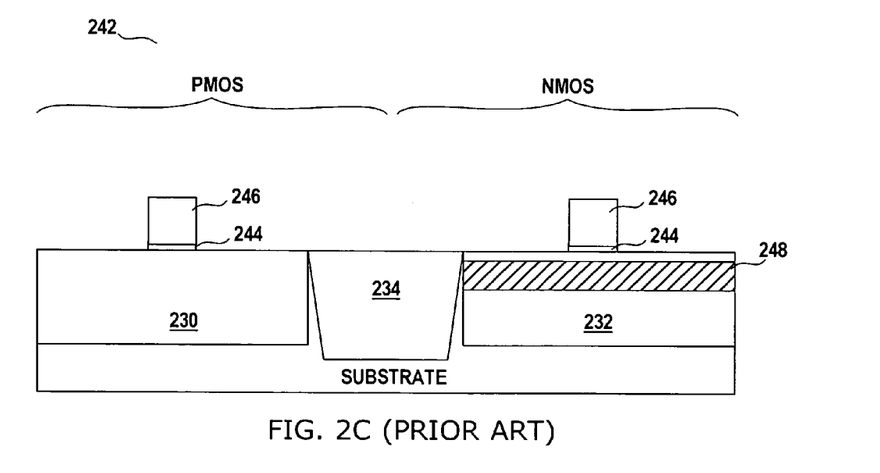

The process steps 210, 212, and 214 provide the gate structures for the PMOS and NMOS devices, as shown in the cross-sectional view 242 of the CMOS structure depicted in FIG. 2C. Specifically, the process step 210 forms a gate dielectric layer 244, followed by the formation of a gate conductive layer 246 by the process step 212 of gate conductive layer deposition and then the process step 214 of gate patterning.

Figure 2D:
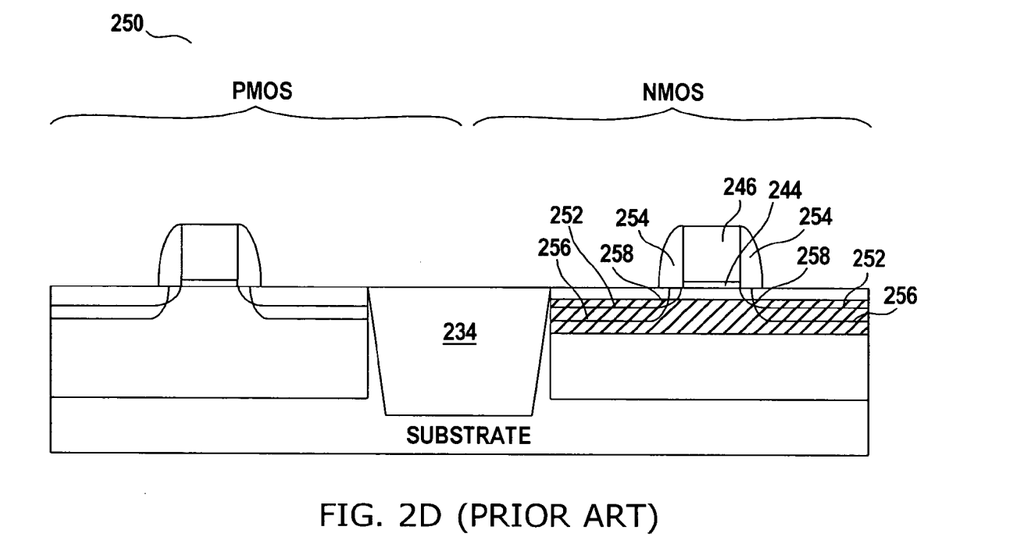

Referring to FIGS. 2A and 2D, the process step 216 forms one or more lightly doped drain (LDD) regions 252 in the CMOS structure depicted by the cross-sectional view 250. The process step 218 forms one or more gate sidewall spacers 254 on the sidewalls of the gate dielectric layer 244 and the gate conductive layer 246. The process step 220 forms source/drain (S/D) regions 256. The LDD and S/D regions merge together at junctions 258. Thereafter, a silicide layer (not shown in this figure) is formed during the process step 222 to reduce the sheet resistance of the gate conductive layer 246 and the S/D regions 256. A dielectric material (not shown in this figure) is deposited in the process step 224 followed by contact definition during the process step 226 for construction of further interconnect structures.

Gate dielectric nitridization is a popular technology to reduce gate current leakage. However, typical nitridization processes require a high temperature thermal treatment, which often causes the buried doped region 238 as shown in FIG. 2B to expand as the diffused buried doped region 248 as shown in FIG. 2C. The nitridization process induces problems of, for example, dopant control and dopant out-diffusion.

Figure 3A:
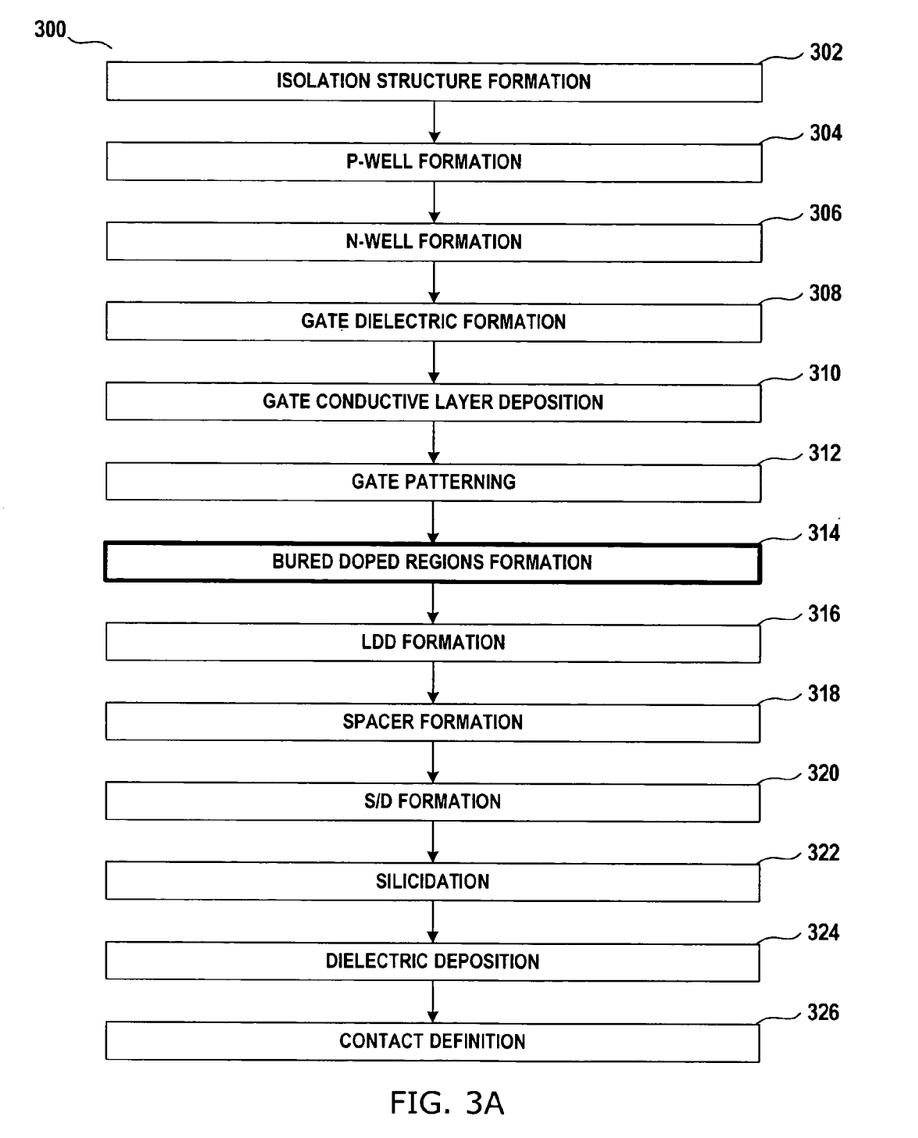
FIGS. 3A through 3C present a fabrication method for constructing a CMOS device used in a memory cell in accordance with one embodiment of the present invention.
Figure 3B:
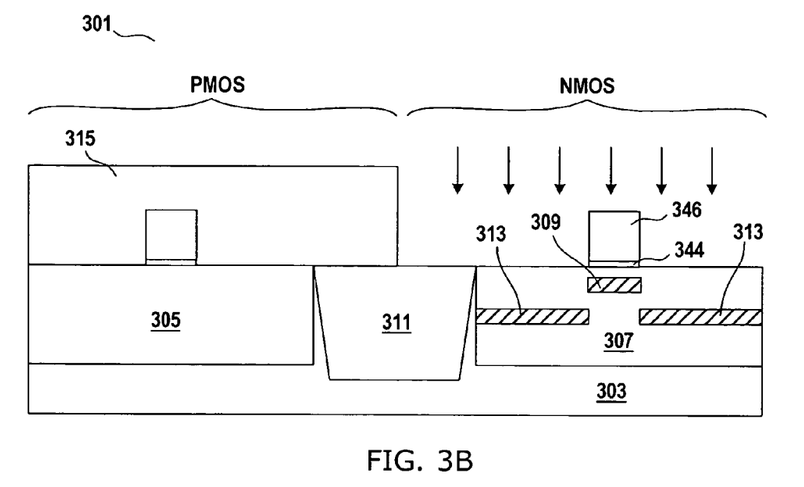

FIG. 3A presents a fabrication method 300 for constructing a CMOS device used in a memory cell, such as an SRAM cell, in accordance with one embodiment of the present invention. FIG. 3B shows a CMOS structure 301 immediately after the process step 314 in FIG. 3A. Now referring to both FIGS. 3A and 3B, the method 300 starts with the step 302 in which an isolation structure 311 is formed on a semiconductor substrate 303 to isolate an N-well 305 and a P-well 307. The isolation structure 311 can be a shallow trench isolation (STI) structure or a local oxidation of silicon (LOCOS) structure. The wells 305 and 307 are formed during the steps 304 and 306, using standard semiconductor processing techniques, as required to provide active areas for construction of PMOS and NMOS devices.

The process steps 308, 310, and 312 provide the gate structures for the PMOS and NMOS devices, as shown in the cross-sectional view of the CMOS structure depicted in FIG. 3B. Specifically, the process step 308 forms a gate dielectric layer 344, followed the formation of a gate conductive layer 346 constructed by the process step 310 of gate conductive layer deposition and then the process step 312 of gate patterning. The gate dielectric layer 344 can be made substantially of a material, such as oxide, SiON, Si3N4, Ta2O5, Al2O3, HfO, PEOX, TEOS, nitrogen content oxide layer, nitrided oxide, Hf content oxide, Ta content oxide, Al content oxide, high K material (K>5), or a combination thereof.

During the process step 314, a first buried doped region 309, and one or more second doped regions 313 are formed in the P-well 307. In this embodiment, a photoresist layer 315 is selectively formed to cover the N-well 305 that is used for construction of a PMOS device. The implanted ions are P-type ions, such as B11 or $BF_2$, at an energy level between about 5 Kev and 80 Kev. This provides the first and second buried doped regions 309 and 313 with an ion density ranging between about 3E12 $cm^{-2}$ and 5E13 $cm^{-2}$. The shortest distance between the first buried doped region 309 and the gate dielectric layer 344 is no greater than about 1,500 angstroms. The shortest distance between the second buried doped region 313 and a top surface of the P-well 307 is between about 1,000 and 3,000 angstroms. Specifically, the second buried doped regions 313 are formed beneath at least one location of the P-well 307 earmarked for forming a lightly doped drain (LDD) region that is usually closer to the top surface of the P-well 307 as opposed to the second buried doped regions 313.

The first and second buried doped regions 309 and 313 are formed after the gate dielectric layer 344 and the gate conductive layer 346 have been constructed. Therefore, any thermal treatment process used for forming a nitrided gate dielectric layer will not affect the dopant density of the first and second buried doped regions 309 and 313. This helps to avoid the problem that the dopants are driven out of the buried doped regions formed by conventional methods during thermal treatment processes.

Figure 3C:
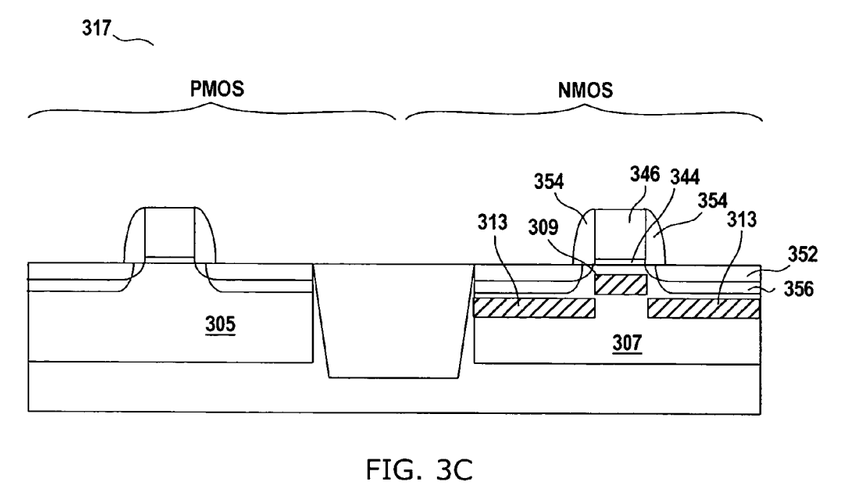

FIG. 3C shows a cross-sectional view 317 of the CMOS structure immediately after the process step 320 in FIG. 3A. Now referring to FIGS. 3A and 3C, the LDD regions 352 are formed during the process step 316, gate sidewall spacers 354 are formed on sidewalls of gate dielectric layer 344 and the gate conductive layer 346 during the process step 318, and the S/D regions 356 are formed during the process step 320.

Thereafter, a silicide layer (not shown in this figure) is formed during the process step 322 to reduce the sheet resistance of the gate conductive layer 346 and the S/D regions 356. A dielectric material (not shown in this figure) is deposited in the process step 324 followed by contact definition during the process step 326 for further construction of interconnect structures.

The first buried doped region 309 provides protection against channel punch-through between the S/D regions 356. The second buried doped region 313 provides protection against punch-through between the S/D region 356 and the N-well 305. As a result, the proposed fabrication process 300 increases the threshold voltage stability, provides in-site well isolation, and decreases the junction capacitance. This, in turn, reduces the soft error rate for memory chips that use the CMOS devices constructed by the proposed method. It is noted that while, in this embodiment, the memory chips are SRAM chips, they can also be other types of chips, such as DRAM chips and flash memory chips.

Figure 4A:
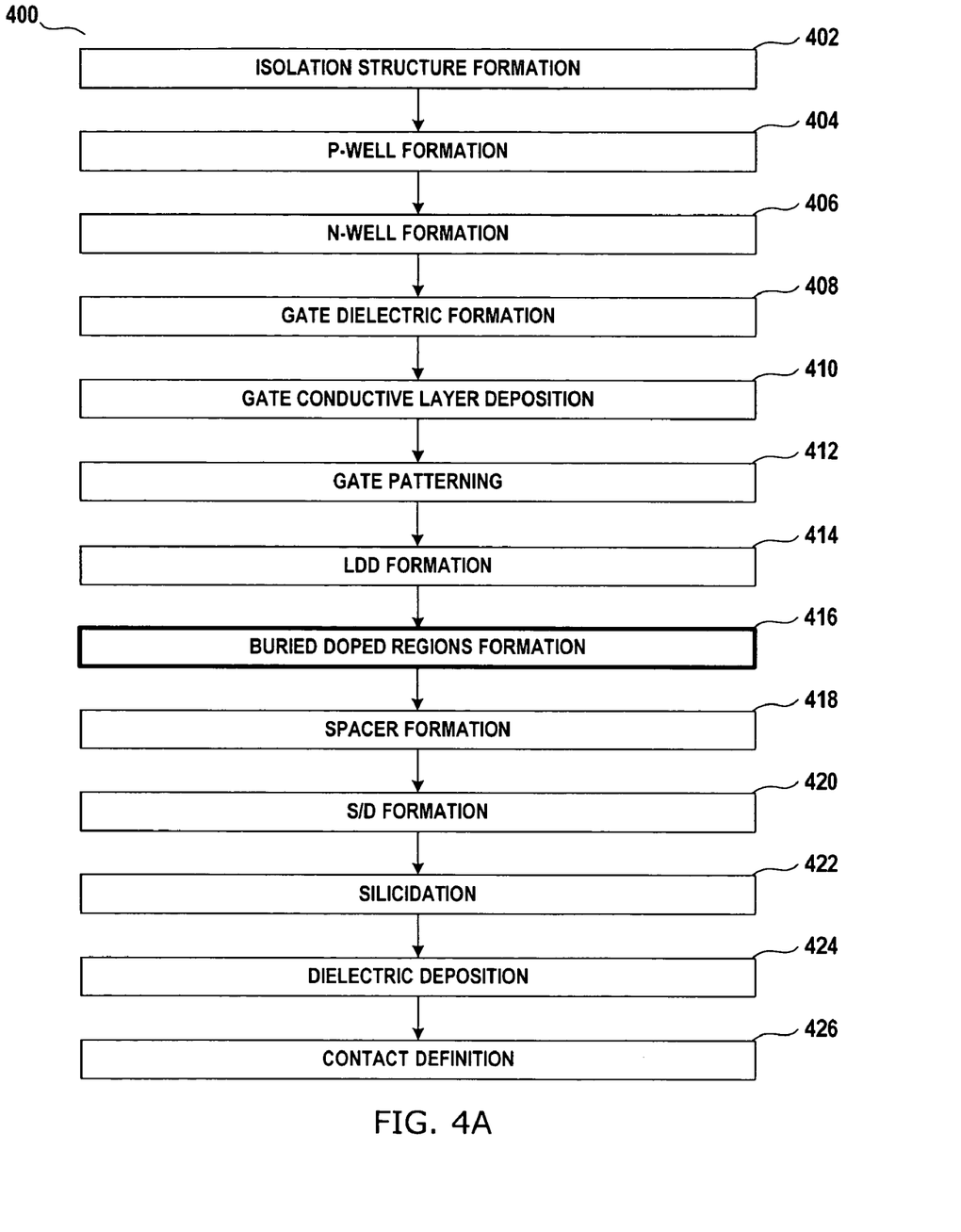
FIGS. 4A and 4B present a fabrication method for constructing a CMOS device used in a memory cell in accordance with another embodiment of the present invention.
Figure 4B:
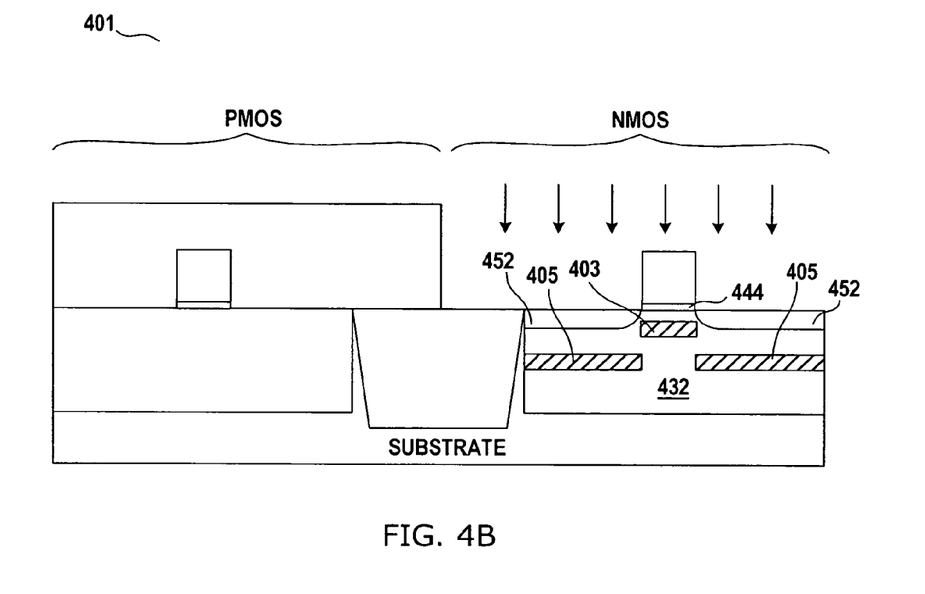

FIG. 4A presents a fabrication method for constructing a CMOS device used in a memory cell in accordance with another embodiment of the present invention. The steps of the fabrication method 400 are similar to the method 300 as shown in FIG. 3A, except that the process step sequence has been changed. In FIG. 4A, the step 416 of forming the buried doped regions has been moved to at least after the process step 414 of forming LDD regions. A cross-sectional 401 of the resultant CMOS structure after the process step 416 is shown in FIG. 4B.

In the process step 416, an ion implantation of P-type dopant, such as B11 or $BF_2$, is performed to form a first buried doped region 403 and the second buried doped regions 405 in the P-well 432. The shortest distance between the first buried doped region 403 and the gate dielectric layer 444 is no greater than about 1,500 angstroms. The shortest distance between the second buried doped region 405 and a top surface of the P-well 432 is between about 1,000 and 3,000 angstroms. Specifically, the second buried doped regions 405 are formed beneath the LDD regions 452. The ion implantation is performed at an energy level between about 5 Kev and 80 Kev. This provides the first and second buried doped regions 403 and 405 with an ion density ranging between about 3E12 $cm^{-2}$ and 5E13 $cm^{-2}$.

The fabrication method 400 continues after the process step 416 with the formation of the gate sidewall spacers during the process step 418 and the formation of the S/D regions during the process step 420. The process steps 422 through 426 are then performed to complete the SRAM device fabrication.

Figure 5A:
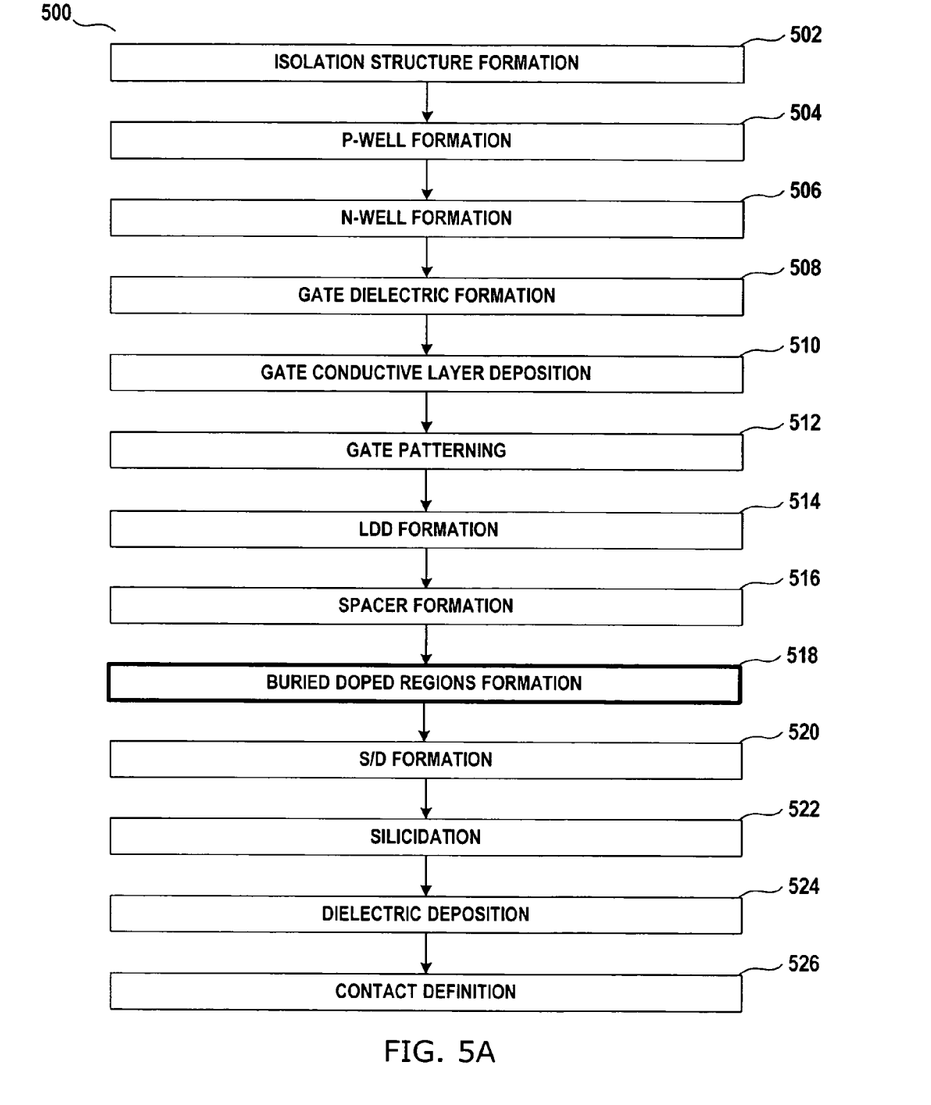
FIGS. 5A through 5C present a fabrication method for constructing a CMOS device used in a memory cell in accordance with yet another embodiment of the present invention.
Figure 5B:
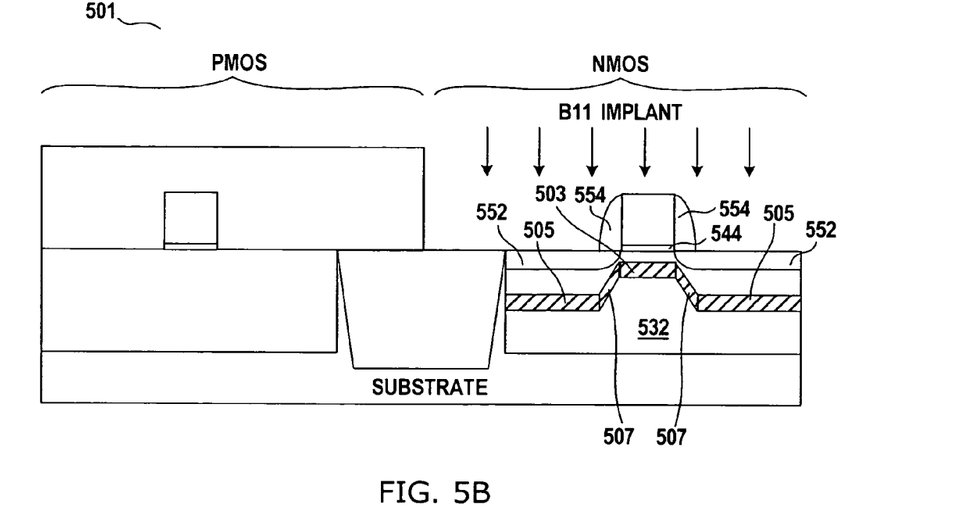

FIG. 5A presents a fabrication method 500 for constructing a CMOS device used in a memory cell in accordance with another embodiment of the present invention. The steps of the fabrication method 500 are similar to the method 300 as shown in FIG. 3A, except that the process step sequence has been changed. In FIG. 5A, the step 518 of forming the buried doped regions has been moved to at least after the process step 516 of forming sidewall spacers. A cross-sectional 501 of the resultant CMOS structure after the process step 518 is shown in FIG. 5B.

In this example, an ion implantation of P-type dopant is performed, thereby creating the first buried doped region 503, the second buried doped region 505 and the third buried doped region 507. Since the gate structure provides additional reduction of the ion implantation energy under the gate structure, the first buried doped region 503 is shallower than the second buried doped regions 505. Note that the LDD regions 552 and the sidewall spacers 554 have been deposited prior to the step 518. The varying thickness (height) of the sidewall spacers 554 affects the implant energy, thereby creating the slanted third buried doped region 507 extending from the first buried doped region 503 to the second buried doped regions 505. Thus, the depth of the slanted third buried doped regions 507 vary continuously from shallow to deep. The shortest distance between the first buried doped region 503 and the gate dielectric layer 544 is no greater than about 1,500 angstroms. The shortest distance between the second buried doped region 505 and a top surface of the P-well 532 is between about 1,000 and 3,000 angstroms. Specifically, the second buried doped regions 505 are formed beneath the LDD regions 552. The ion implantation is performed at an energy level between about 5 Kev and 80 Kev. This provides the first, second and third buried doped regions 503, 505 and 507 and with an ion density ranging between about $3E12$ $cm^{-2}$ and $5E13$ $cm^{-2}$.

Figure 5C:
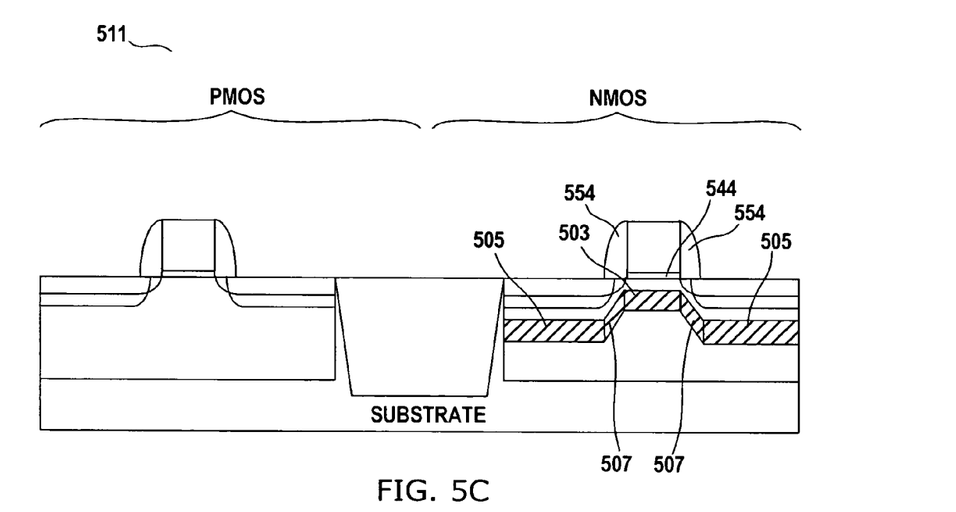

The fabrication method 500 continues after the step 518 with the formation of the S/D regions in the process step 520, and produces a cross-sectional view 511 of the CMOS structure as shown in FIG. 5C. The process steps 522 through 526 are then performed to complete the SRAM device fabrication.

The above illustration provides many different embodiments or embodiments for implementing different features of the invention. Specific embodiments of components and processes are described to help clarify the invention. These are, of course, merely embodiments and are not intended to limit the invention from that described in the claims.

Although the invention is illustrated and described herein as embodied in one or more specific examples, it is nevertheless not intended to be limited to the details shown, since various modifications and structural changes may be made therein without departing from the spirit of the invention and within the scope and range of equivalents of the claims. Accordingly, it is appropriate that the appended claims be construed broadly and in a manner consistent with the scope of the invention, as set forth in the following claims.

What is claimed is:

1. A method for improving threshold voltage stability of at least one metal-oxide-semiconductor (MOS) device, comprising:
    forming at least one well on a semiconductor substrate;
    forming a gate dielectric layer on the well of the semiconductor substrate;
    forming a gate conductive layer on the gate dielectric layer;
    patterning the gate conductive layer and the gate dielectric layer;
    implanting ions into the well to form at least one first buried doped region beneath the gate dielectric layer, and one or more second buried doped regions within the well, wherein a shortest distance between the first buried doped region and the gate dielectric layer is no greater than about 1,500 angstroms; and
    forming one or more lightly doped drain (LDD) regions adjacent to the patterned gate conductive and dielectric layers, wherein the one or more second buried doped regions are located beneath the LDD regions.

2. The method of claim 1 wherein the well is a P-type well.

3. The method of claim 1 wherein a shortest distance between the second buried doped region and a top surface of the well is between about 1,000 and 3,000 angstroms.

4. The method of claim 3 wherein the first and second buried doped regions have an ion density ranging between about $3E12$ $cm^{-2}$ and $5E13$ $cm^{-2}$.

5. The method of claim 4 wherein the ions are boron ions.

6. The method of claim 5 wherein the ions are implanted at an energy level between about 5 Kev and 80 Kev.

7. The method of claim 2, wherein the one or more lightly doped drain (LDD) regions are formed on the P-well.

8. The method of claim 7, before the step of implanting ions, further comprising forming one or more sidewall spacers on side walls of the gate conductive layer and the gate dielectric layer.

9. The method of claim 8 wherein the step of implanting ions further forms one or more third buried doped regions extending from the first buried doped region to the second buried doped regions.

10. A method for improving threshold voltage stability of at least one metal-oxide-semiconductor (MOS) device used in a memory cell, comprising:
    forming at least one P-type well on a semiconductor substrate;
    forming a gate dielectric layer on the P-type well of the semiconductor substrate;
    forming a gate conductive layer on the gate dielectric layer;
    forming one or more lightly doped drain (LDD) regions adjacent to the gate dielectric layer, on the P-type well;
    implanting ions into the P-type well to form a first buried doped region beneath the gate dielectric layer, and one or more second buried doped regions beneath the LDD regions, wherein a shortest distance between the first buried doped region and the gate dielectric layer is no greater than about 1,500 angstroms;
    forming one or more spacers on sidewalls of the gate conductive layer and the gate dielectric layer; and
    forming one or more source/drain regions adjacent to the sidewall spacers, on the P-type well.

11. The method of claim 10 wherein a shortest distance between the second buried doped region and a top surface of the P-type well is between about 1,000 and 3,000 angstroms.

12. The method of claim 11 wherein the first and second buried doped regions have an ion density within a range between about 3E12 cm−2 and 5E13 cm−2.

13. The method of claim 12 wherein the ions are implanted at an energy level between about 5 Kev and 80 Kev.

14. A method for improving threshold voltage stability of at least one metal-oxide-semiconductor (MOS) device used in a memory cell, comprising:
    forming at least one P-type well on a semiconductor substrate;
    forming a gate dielectric layer on the P-type well of the semiconductor substrate and a gate conductive layer on the gate dielectric layer;
    patterning the gate conductive layer and the gate dielectric layer;
    forming one or more lightly doped drain (LDD) regions adjacent to the gate dielectric layer, on the P-type well;
    forming one or more spacers on sidewalls of the patterned gate conductive layer and the gate dielectric layer;
    implanting ions into the P-type well to form a first buried doped region beneath the gate dielectric layer, one or more second buried doped regions beneath the LDD regions, and one or more slanted third buried doped regions extending from the first buried doped region to the second buried doped regions, wherein the ions are implanted after the one or more sidewall spacers are formed; and forming one or more source/drain regions adjacent to the sidewall spacers, on the P-type well.

15. The method of claim 14 wherein a shortest distance between the first buried doped region and the gate dielectric layer is no greater than about 1,500 angstroms.

16. The method of claim 15 wherein a shortest distance between the second buried doped region and a top surface of the P-type well is between about 1,000 and 3,000 angstroms.

17. The method of claim 16 wherein the first, second and third buried doped regions have an ion density within a range between about $3E12$ $cm^{-2}$ and $5E13$ $cm^{-2}$.

18. The method of claim 17 wherein the ions are implanted at an energy level between about 5 Kev and 80 Kev.

* * * * *